United States Patent
Lee et al.

(10) Patent No.: US 9,219,025 B1
(45) Date of Patent: Dec. 22, 2015

(54) MOLDED FLIP-CLIP SEMICONDUCTOR PACKAGE

(71) Applicant: Infineon Technologies AG, Neubiberg (DE)

(72) Inventors: Swee Kah Lee, Melaka (MY); Chee Hong Fang, Ipoh (MY); Mei Chin Ng, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/460,463

(22) Filed: Aug. 15, 2014

(51) Int. Cl.
| | |
|---|---|
| *H01L 23/495* | (2006.01) |
| *H01L 21/56* | (2006.01) |
| *H01L 23/00* | (2006.01) |
| *H01L 21/48* | (2006.01) |
| *H01L 23/31* | (2006.01) |
| *H01L 23/29* | (2006.01) |

(52) U.S. Cl.
CPC ...... *H01L 23/49503* (2013.01); *H01L 21/4828* (2013.01); *H01L 21/561* (2013.01); *H01L 21/565* (2013.01); *H01L 23/293* (2013.01); *H01L 23/3135* (2013.01); *H01L 23/49541* (2013.01); *H01L 23/49582* (2013.01); *H01L 24/81* (2013.01); *H01L 24/97* (2013.01); *H01L 2924/01028* (2013.01); *H01L 2924/0133* (2013.01); *H01L 2924/01046* (2013.01); *H01L 2924/01079* (2013.01); *H01L 2924/1711* (2013.01); *H01L 2924/17738* (2013.01); *H01L 2924/17747* (2013.01)

(58) Field of Classification Search
CPC ......... H01L 24/44; H01L 24/89; H01L 21/60; H01L 23/495
See application file for complete search history.

(56) References Cited

U.S. PATENT DOCUMENTS

| | | | | |
|---|---|---|---|---|
| 6,586,677 | B2 * | 7/2003 | Glenn | 174/528 |
| 7,064,012 | B1 * | 6/2006 | Lin | 438/118 |
| 2002/0084518 | A1 * | 7/2002 | Hasebe et al. | 257/676 |
| 2005/0146057 | A1 | 7/2005 | Khor et al. | |
| 2007/0001278 | A1 * | 1/2007 | Jeon et al. | 257/676 |
| 2009/0127682 | A1 * | 5/2009 | Kim et al. | 257/676 |
| 2011/0089546 | A1 | 4/2011 | Bayan | |
| 2011/0198741 | A1 | 8/2011 | Alberghini et al. | |
| 2012/0056334 | A1 | 3/2012 | Yang et al. | |
| 2015/0076675 | A1 * | 3/2015 | Real et al. | 257/676 |

FOREIGN PATENT DOCUMENTS

| | | |
|---|---|---|
| DE | 112006001663 T5 | 5/2008 |
| DE | 102012215705 A1 | 3/2014 |
| WO | 2011046673 A1 | 4/2011 |

\* cited by examiner

*Primary Examiner* — Matthew W Such
*Assistant Examiner* — Krista Soderholm
(74) *Attorney, Agent, or Firm* — Murphy, Bilak & Homiller, PLLC

(57) ABSTRACT

A molded flip-chip semiconductor package includes a leadframe having opposing first and second main surfaces, a first metallization on the first main surface, a second metallization on the second main surface, recessed regions which extend from the second main surface toward the first main surface, and spaced apart leads chemically etched into the leadframe between gaps in the first metallization. The package further includes a semiconductor die having a plurality of pads facing and attached to the leads of the leadframe, a first molding compound that fills the recessed regions, and a second molding compound that encases the semiconductor die and fills the space between the leads such that the second molding compound abuts the first molding compound. A is the overall thickness of the leadframe, B is the spacing between adjacent ones of the leads, and B/A<1.

15 Claims, 8 Drawing Sheets

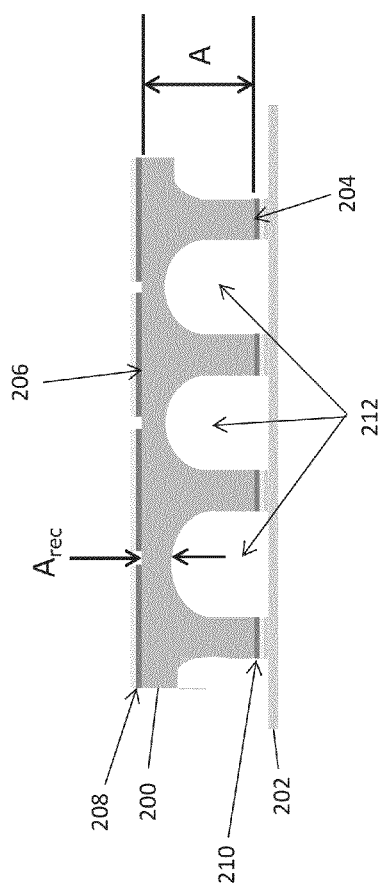
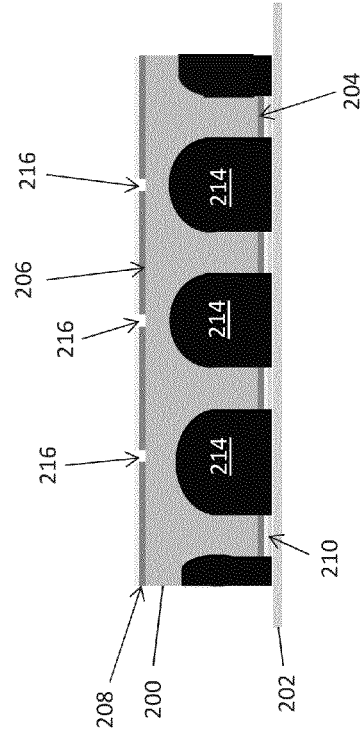
Figure 2A
Figure 2B

MOLDED FLIP-CLIP SEMICONDUCTOR PACKAGE

TECHNICAL FIELD

The present application relates to semiconductor packages, in particular molded flip-chip semiconductor packages.

BACKGROUND

Flip-chip interconnect technology for molded flip-chip semiconductor packages involves depositing solder bumps on the pads of a semiconductor die. The die is mounted to the leadframe by flipping the die over so that its top side faces down, and aligned so that its pads align with matching leads of the leadframe. The solder is then reflowed to complete the interconnect, or alternatively, if the flip chip uses diffusion bonding method then no reflow is required. This is in contrast to wire bonding, in which the die is mounted upright and wires are used to interconnect the die pads to the leadframe. Conventional molded flip-chip semiconductor packages have a lead spacing (B) to leadframe thickness (A) ratio of B/A>1, meaning that the lead spacing depends directly on the leadframe thickness. Thin leadframes cannot be used for many types of semiconductor devices such as power devices, limiting the amount by which certain types of semiconductor dies can shrink in size for molded flip-chip semiconductor packages. Die placement tolerance is often imprecise e.g. +/−0.050 mm, requiring a large area for placing semiconductor dies on leadframes. This in turn further limits any die size reductions that can be practically realized. As such, there is a need for reducing the lead spacing without reducing leadframe thickness. Also with conventional leadframe technologies, the semiconductor die size cannot be reduced without also reducing the footprint of the package which in turn is controlled by the end customer PCB (printed circuit board) footprint.

SUMMARY

According to an embodiment of a method of manufacturing a molded flip-chip semiconductor package, the method comprises: providing a leadframe having opposing first and second main surfaces, a first metallization on the first main surface, a second metallization on the second main surface, and recessed regions which extend from the second main surface toward the first main surface; filling the recessed regions with a first molding compound such that the leadframe is protected by the first molding compound and the second metallization at a second side of the leadframe and exposed between gaps in the first metallization at a first side of the leadframe opposite the second side; and etching the exposed part of the leadframe between the gaps in the first metallization with a chemical etchant to form spaced apart leads at the first side of the leadframe, the first molding compound and the second metallization protecting the leadframe from the chemical etchant at the second side.

According to an embodiment of a molded flip-chip semiconductor package, the package comprises a leadframe having opposing first and second main surfaces, a first metallization on the first main surface, a second metallization on the second main surface, recessed regions which extend from the second main surface toward the first main surface, and spaced apart leads chemically etched into the leadframe between gaps in the first metallization. The molded flip-chip semiconductor package further comprises a semiconductor die having a plurality of pads facing and attached to the leads of the leadframe, a first molding compound that fills the recessed regions, and a second molding compound that encases the semiconductor die and fills the space between the leads such that the second molding compound abuts the first molding compound. A is the overall thickness of the leadframe, B is the spacing between adjacent ones of the leads, and B/A<1.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2, which includes FIGS. 2A through 2H, illustrates an embodiment of a method of manufacturing a molded flip-chip semiconductor package having a lead spacing to leadframe thickness ratio of <1.

FIG. 3, which includes

DETAILED DESCRIPTION

The embodiments described herein provide a lead spacing (B) to leadframe thickness (A) ratio of B/A<1 for molded flip-chip semiconductor packages, without reducing the overall leadframe thickness or employing expensive plating processes. Instead, the backside of the leadframe is pre-molded with a molding compound that fills recessed regions of the leadframe which extend from the bottom surface of the leadframe toward the top surface of the leadframe. The leadframe is thinner in these recessed regions and thicker elsewhere. The molding compound, in conjunction with a metallization disposed on the bottom surface of the leadframe, protects the backside of the leadframe from a subsequent chemical etching process. The chemical etching process etches away the part of the leadframe unprotected by a die attach metallization disposed on the top surface of the leadframe. The die attach metallization is patterned such that the chemical etching process at the front side of the leadframe etches the exposed part of the leadframe to form the package leads. A lead spacing (B) to leadframe thickness (A) ratio of B/A<1 can be realized because the leadframe thickness is reduced in the recessed regions which are protected at the backside by the molding compound and chemically etched at the front side to form the leads. Less leadframe material is thus removed to form the leads, permitting a reduced lead spacing. Semiconductor dies are then attached to the leads of the leadframe via the die attach metallization in a flip-chip configuration and molded. The packages can be marked if desired and singulated into separate packages e.g. by sawing or other standard singulation (separation) process. The embodiments described herein allow for the die size to be reduced without necessarily having to change the leadframe thickness or the package footprint.

Figure 1:
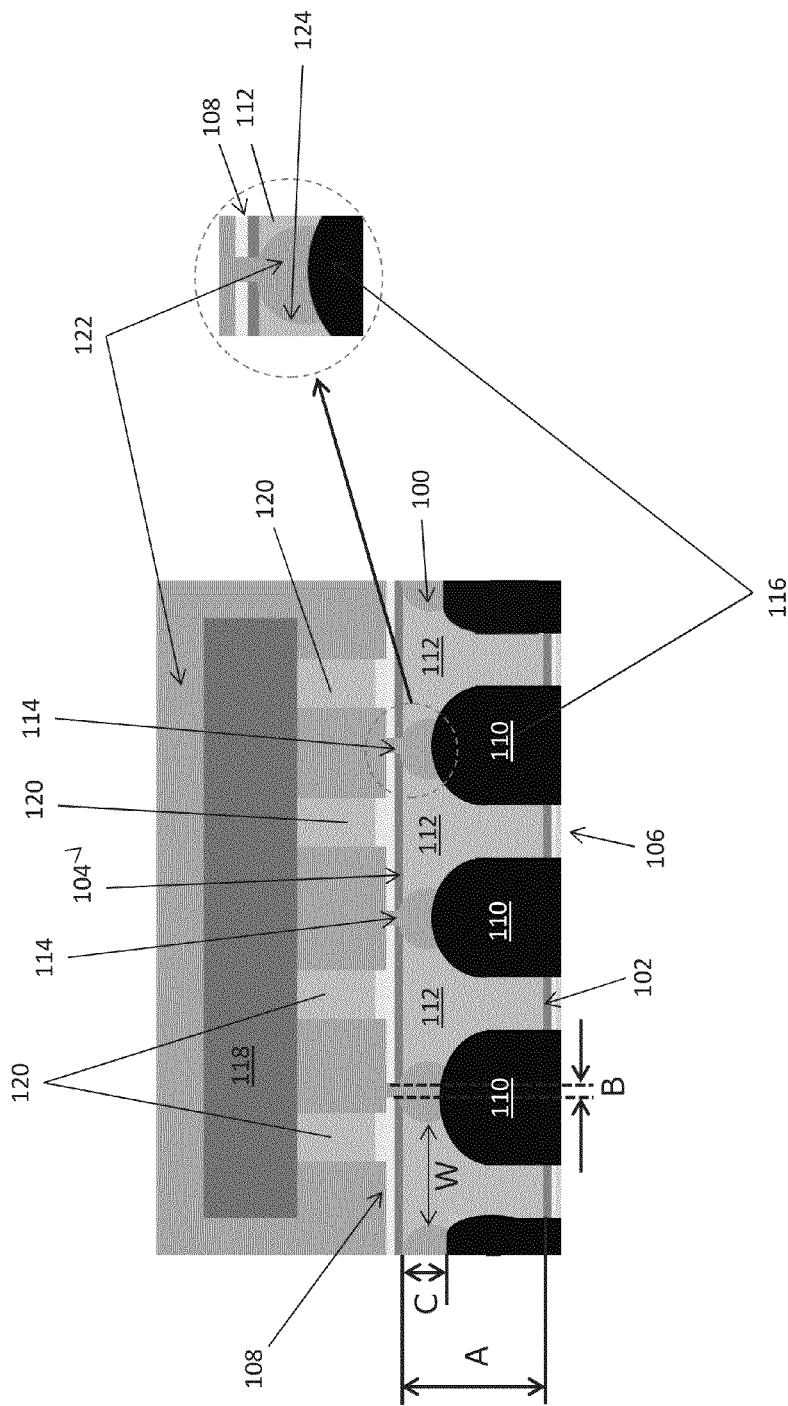
FIG. 1 illustrates a sectional view of an embodiment of a molded flip-chip semiconductor package having a lead spacing to leadframe thickness ratio of <1.

FIG. 1 illustrates an embodiment of a molded flip-chip semiconductor package that has a lead spacing (B) to leadframe thickness (A) ratio of B/A<1. The molded flip-chip semiconductor package comprises a leadframe 100 having opposing bottom (back) and top (front) surfaces 102, 104, a single or multi-layer metallization 106 on the bottom surface 102, a single or multi-layer die attach metallization 108 on the top surface 104, recessed regions 110 which extend from the bottom surface 102 toward the top surface 104, and spaced apart leads 112 chemically etched into the leadframe 100 between gaps (openings) 114 in the die attach metallization 108. The leads 112 have an overall thickness (C) which is less than the overall thickness (A) of the leadframe 100. The leads 112 are formed by chemically etching the exposed part of the leadframe 100 between the gaps 114 in the die attach metallization 108 at the front side of the leadframe 100 as described in more detail later herein.

A molding compound 116 fills the recessed regions 110 of the leadframe 100. The molding compound 116 and the metallization 106 on the bottom surface 102 of the leadframe 100 collectively protect the leadframe 100 from the chemical etching process at the backside side of the leadframe 100. As a result, the thickness of the leadframe 100 in the recessed regions 110 determines the minimum lead spacing (B). Because the leadframe 100 is thinner in the recessed regions 110 and thicker elsewhere, the molded flip-chip semiconductor package can have a lead spacing (B) to leadframe thickness (A) ratio of B/A<1. In some embodiments, the thickness of the leadframe 100 in the recessed regions 110 is such that 0.2<B/A<1. This way, thick leadframes can be used e.g. for power semiconductor applications and still have small lead spacing. Further details of the chemical etching process used to form the leads 112 of the molded flip-chip semiconductor package are described in more detail later herein.

The molded flip-chip semiconductor package further comprises a semiconductor die 118 having a plurality of pads 120 facing and attached to the leads 112 of the leadframe 100. The package can include one or more semiconductor dies connected to the leadframe 100 in a flip-chip configuration. A second molding compound 122 encases each semiconductor die 118 and fills the space between the leads 112 such that the second molding compound 122 abuts the molding compound 116 which fills the recessed regions 110 of the leadframe 100. In some embodiments, the leadframe 100 comprises copper and the metallization 106 on the bottom surface 102 of the leadframe 100 comprises gold. In one particular embodiment, the metallization 106 on the bottom surface 102 of the leadframe 100 comprises NiPdAu and the die attach metallization 108 on the top surface 104 of the leadframe 100 comprise Ag.

The molding compounds 116, 122 of the molded flip-chip semiconductor package can comprise the same or different molding compound materials. For example, the molding compound 116 which fills the recessed regions 110 of the leadframe 100 can have a high glass transition temperature (Tg) e.g. above 180° C. and high thermal conductivity. In one embodiment, the molding compound 116 is a multi-functional molding compound such as a multi-functional epoxy resin-based compound that withstands high temperatures associated with the die attach process. If injection molding is used to form the molding compound 116, an advanced thermoplastic composite having high thermal stability with low shrinkage, low CTE (coefficient of thermal expansion) and high thermal conductivity can be used such as a liquid crystal polymer (LCP) or aluminum nitride filled thermoplastic resin. To enhance adhesion of the mold compound 116 in the recessed regions 110 to copper surrounding the recessed regions 110 in the case of a copper leadframe 100, standard replacement oxide or brown oxide technology can be used.

The second molding compound 122 which encases each semiconductor die 118 and fills the space between the leads 112 can be a multi-aromatic molding compound such as a multi-aromatic, biphenyl, ortho cresol novolac, or polyamide molding compound having a glass transition temperature (Tg) below 180° C., thereby applying lower thermal stress to the package. In general, the type(s) of molding compound materials employed depends on the type of package and the application for which the package is designed.

In each case, the leads 112 can have curved sidewalls 124. The sidewalls 124 of the leads 112 can be curved during the chemical etching process due to undercut. As a result, the leads 112 can have a non-uniform width (W) over the thickness (C) of the leads 112. In one embodiment, the width of the leads 112 decreases further from the top surface 104 of the leadframe 100 to a minimum and then increases. With such a curved sidewall profile for the leads 112, an interlocking connection can be realized between the molding compounds 116, 122 in the space between adjacent leads 112 of the molded flip-chip semiconductor package as illustrated in the exploded view of FIG. 1.

FIG. 2, which includes FIGS. 2A through 2H, illustrates an embodiment of a method of manufacturing the molded flip-chip semiconductor package shown in FIG. 1.

In FIG. 2A, a leadframe 200 is provided which is secured to tape 202. The leadframe 200 has opposing bottom (back) and top (front) surfaces 204, 206, a single or multi-layer die attach metallization 208 on the top surface 106, a single or multi-layer metallization 210 on the bottom surface 204, and recessed regions 212 which extend from the bottom surface 204 of the leadframe 200 toward the top surface 206. The leadframe 200 is thinner ($A_{rec}$) in the recessed regions 212 and thicker (A) elsewhere. The die attach metallization 208 on the top surface 206 of the leadframe 200 is patterned so as to define the lead footprint of the packages to be subsequently formed from the leadframe 200. The leadframe 200 can be purchased or fabricated, and is a stamped, etched or otherwise patterned metal frame, to be connected to pads of a semiconductor die by flip-chip bonding, and provides external electrical connections for a packaged electrical device. The recessed regions 212 can be formed at the backside of the leadframe 200 using any standard leadframe process such as plating, etching, etc.

In FIG. 2B, the leadframe 200 is pre-molded by filling the recessed regions 212 with a first molding compound 214. In one embodiment, the first molding compound 214 is a multi-functional molding compound such as a multi-functional epoxy resin-based compound. The first molding compound 214, in conjunction with the metallization 210 disposed on the bottom surface 204 of the leadframe 200, protects the leadframe 200 from a subsequent chemical etching process used to form leads. The die attach metallization 208 on the top surface 206 of the leadframe 200 similarly protects the leadframe 200 from the subsequent chemical etching process at the top side of the leadframe 200, except between gaps (openings) 216 in the die attach metallization 208. The gaps 216 in the die attach metallization 208 expose part of the underlying leadframe 200, and define the lead footprint to be formed by the subsequent chemical etching process. Side and middle railings (out of view) of the leadframe 200 can comprise nickel so that the first molding compound 214 is secured by nickel.

Figure 2C:
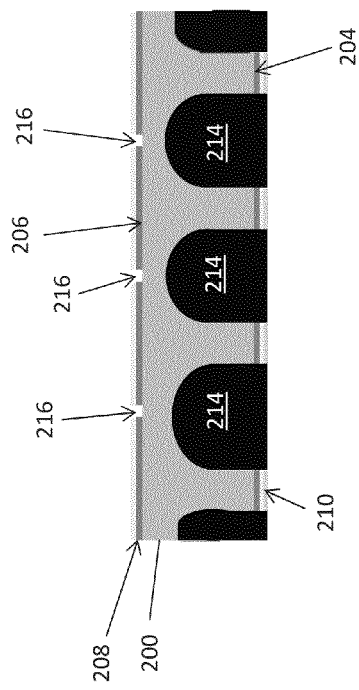

In FIG. 2C, the tape is removed from the backside of the leadframe.

Figure 2D:
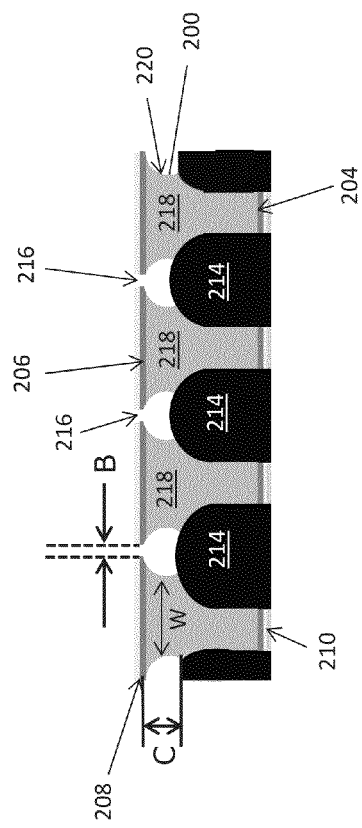

In FIG. 2D, the exposed part of the leadframe 200 between the gaps 216 in the die attach metallization 208 is etched with a chemical etchant to form spaced apart leads 218 at the top side of the leadframe 200. The chemical etchant, first molding compound 214 and metallization 210 on the bottom surface 204 of the leadframe 200 are selected such that the first molding compound 214 and the metallization 210 collectively function as a mask, protecting the leadframe 200 from the chemical etchant at the backside. In one embodiment, the leadframe 200 comprises copper and the metallization 210 on the bottom surface 204 of the leadframe 200 comprises gold. The chemical etchant is selected such that it etches copper selective to gold and selective to the first molding compound 214 such that the first molding compound 214 and the metallization 210 on the bottom surface 204 of the leadframe 200 protect the leadframe 200 from the chemical etchant at the backside. For example, the metallization 210 on the bottom surface 204 of the leadframe 200 can comprise NiPdAu and the chemical etchant can comprise an ammonia-based etchant like ammoniacal.

The die attach metallization 208 also is not removed by the chemical etchant, protecting the part of the leadframe 200 covered by the die attach metallization 208. The gaps 216 in the die attach material 208 are aligned with the recessed regions 212 of the leadframe 200, and therefore expose part of the leadframe 200 to the chemical etchant at the front side. The etching process continues until the leadframe 200 is etched completely through from the front side in the recessed regions 212, forming the leads 218. Because the leadframe 200 is thinner ($A_{rec}$) in the recessed regions 212 and thicker (A) elsewhere, a lead spacing (B) to leadframe thickness (A) ratio of B/A<1 can be realized. In some embodiments, the thickness of the leadframe 200 in the recessed regions 212 is such that 0.2<B/A<1 as previously described herein.

The chemical etching process can result in undercut of the lead sidewalls 220. Undercut width at each side of the leads 218 can range from 5% to 40% of the thickness (C) of the leads 218. Undercut can occur by over-etching the leadframe 200 i.e. applying the chemical etchant too long or by using an isotropic chemical etchant e.g. such as an ammonia-based etchant like ammoniacal in the case of a copper leadframe. To have low undercut, an ammonia etchant with a banking agent or etchant chemical inhibitor can be used. In each case, the leads 218 can have curved sidewalls 220 and a non-uniform width (W) over the thickness (C) of the leads 218. For example, the width of the leads 218 can decrease further from the top surface 206 of the leadframe 200 to a minimum and then increases as shown in FIG. 2D.

Figure 2E:
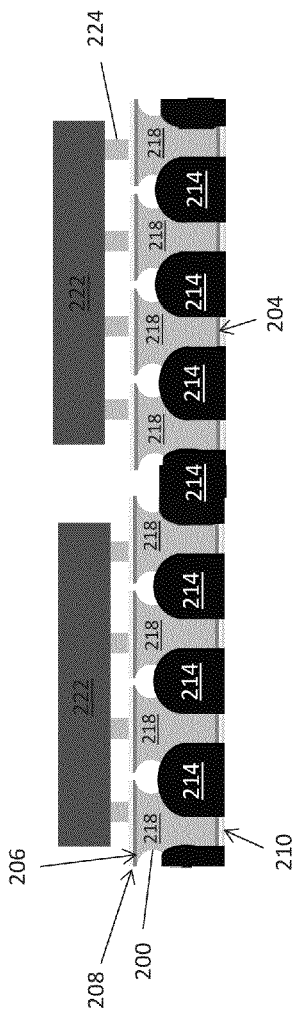

In FIG. 2E, a plurality of semiconductor dies 222 is placed on the leadframe 200 such that pads 224 of the semiconductor dies 222 face the leads 218 of the leadframe 200. The die pads 224 are attached to the leads 218 of the leadframe 200 via the die attach metallization 208 using any standard flip-chip die attach process such as soldering. A plasma oxygen process with argon can be performed prior to die attach.

Figure 2F:
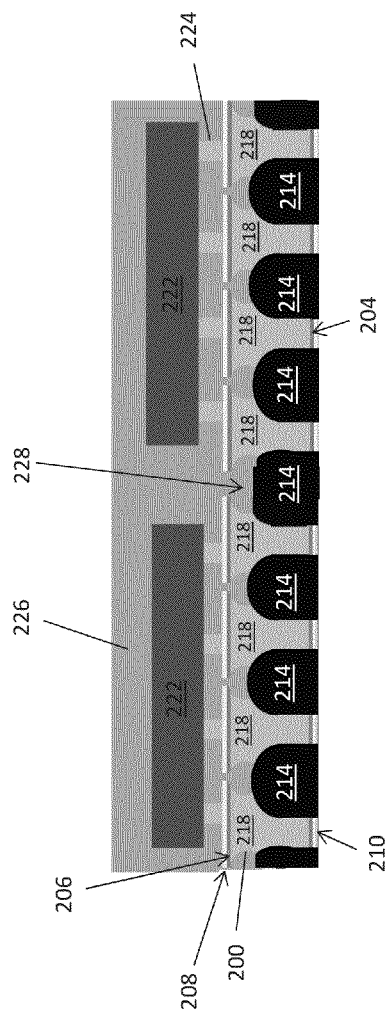

In FIG. 2F, the semiconductor dies 222 are encased with a second molding compound 226 that fills the space 228 between the leads 218 such that the second molding compound 226 abuts the first molding compound 214. An interlocking connection can be formed between the first and second molding compounds 214, 226 in the space 228 between adjacent leads 218 as previously described herein in connection with the exploded view of FIG. 1. The first molding compound 214 can comprise the same or different molding compound material as the second molding compound 226. In one embodiment, the first molding compound 214 is a multi-functional molding compound and the second molding compound 226 is multi-aromatic molding compound. Any standard molding process such as transfer molding, injection molding, compression molding, etc. can be used to form the first and second molding compounds 214, 226. In the case of different mold compound materials, a physical interface arises between the two molding compounds 214, 226.

Figure 2G:
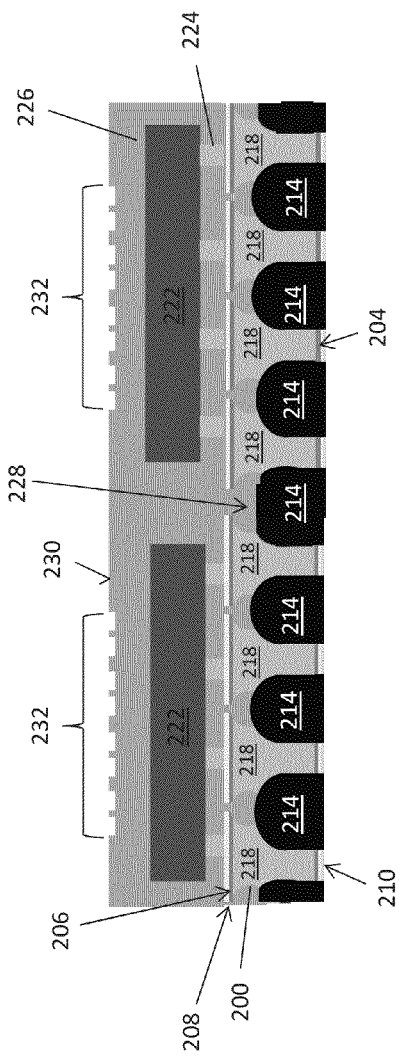

In FIG. 2G, the top surface 230 of the second molding 226 can be marked with identifying information 232 e.g. via laser marking.

Figure 2H:
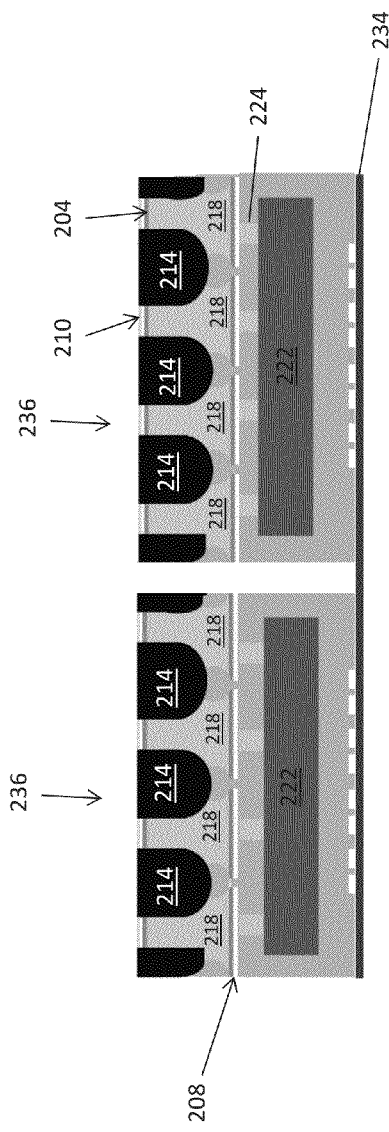

In FIG. 2H, the structure is laminated with a support substrate 234 and the individual packages are then singulated (separated) into physically separate packages 236. Any standard singulation process for molded semiconductor packages can be used such as sawing, etching, laser cutting, etc. Because the leadframe 200 is thinner in the recessed regions 212 and thicker elsewhere, the resulting molded flip-chip semiconductor packages 236 each can have a lead spacing (B) to leadframe thickness (A) ratio of B/A<1.

Figure 3A:
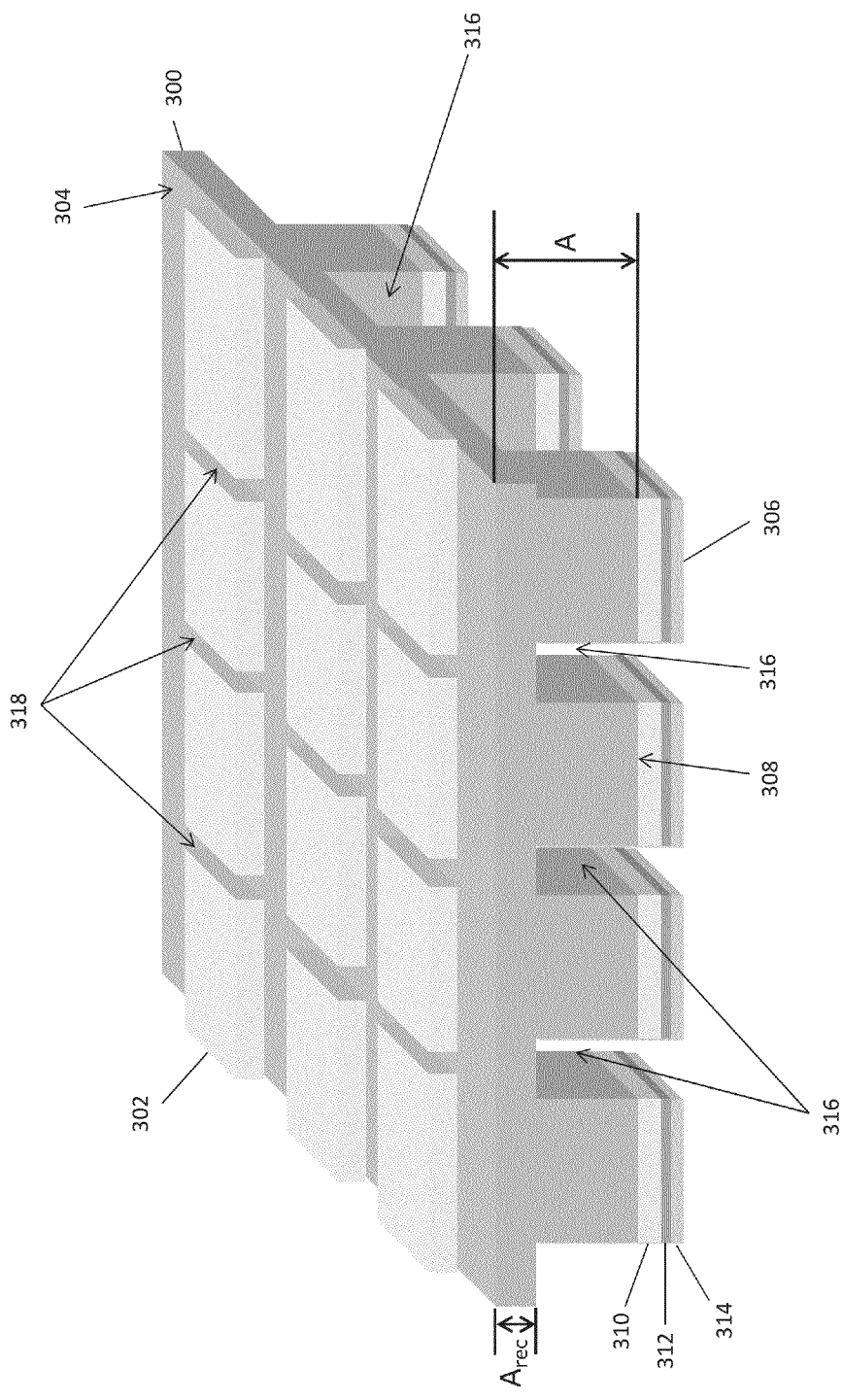
FIGS. 3A through 3C, illustrates an embodiment of a method of pre-molding a leadframe for use in manufacturing molded flip-chip semiconductor packages having a lead spacing to leadframe thickness ratio of <1.
Figure 3B:
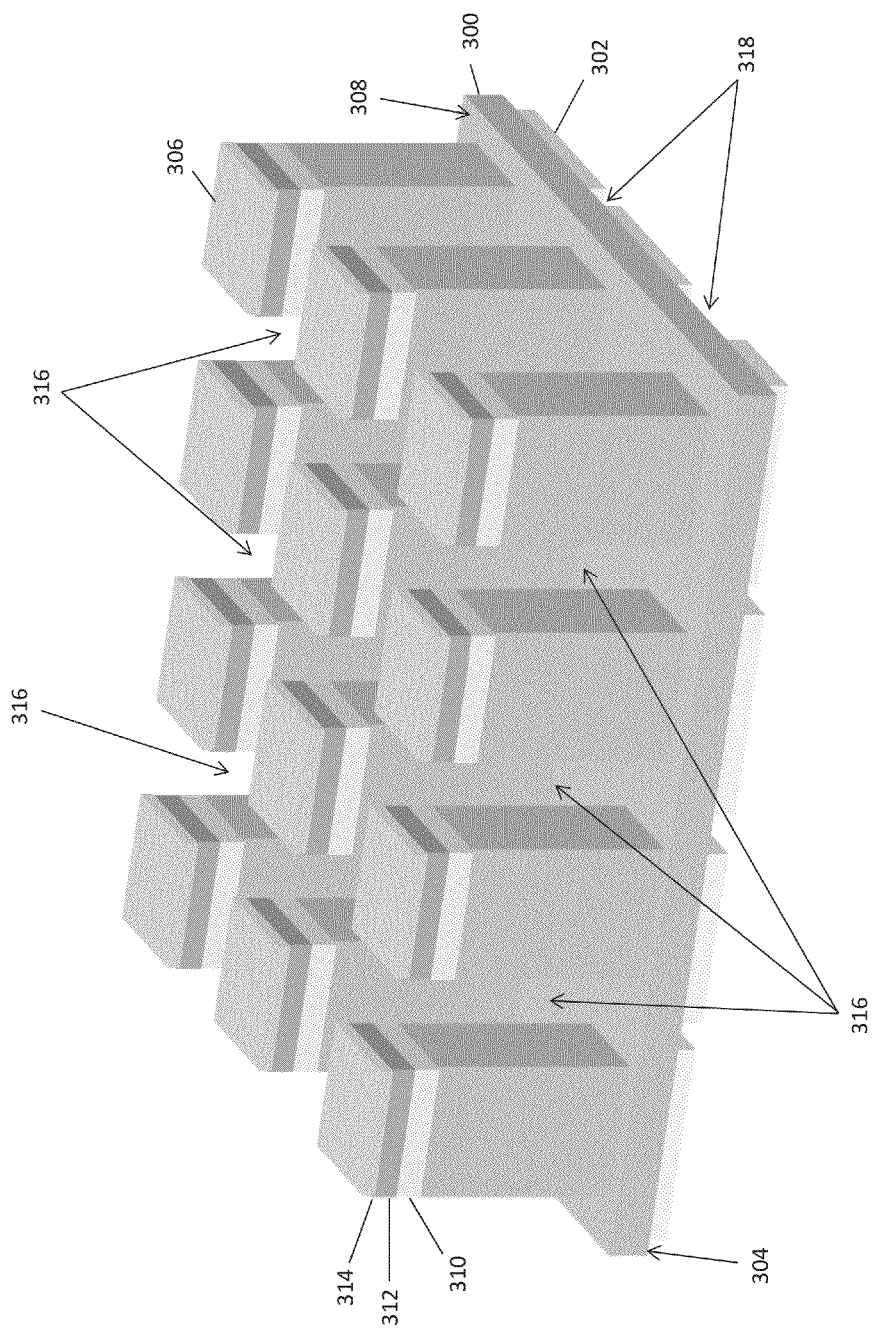
Figure 3C:
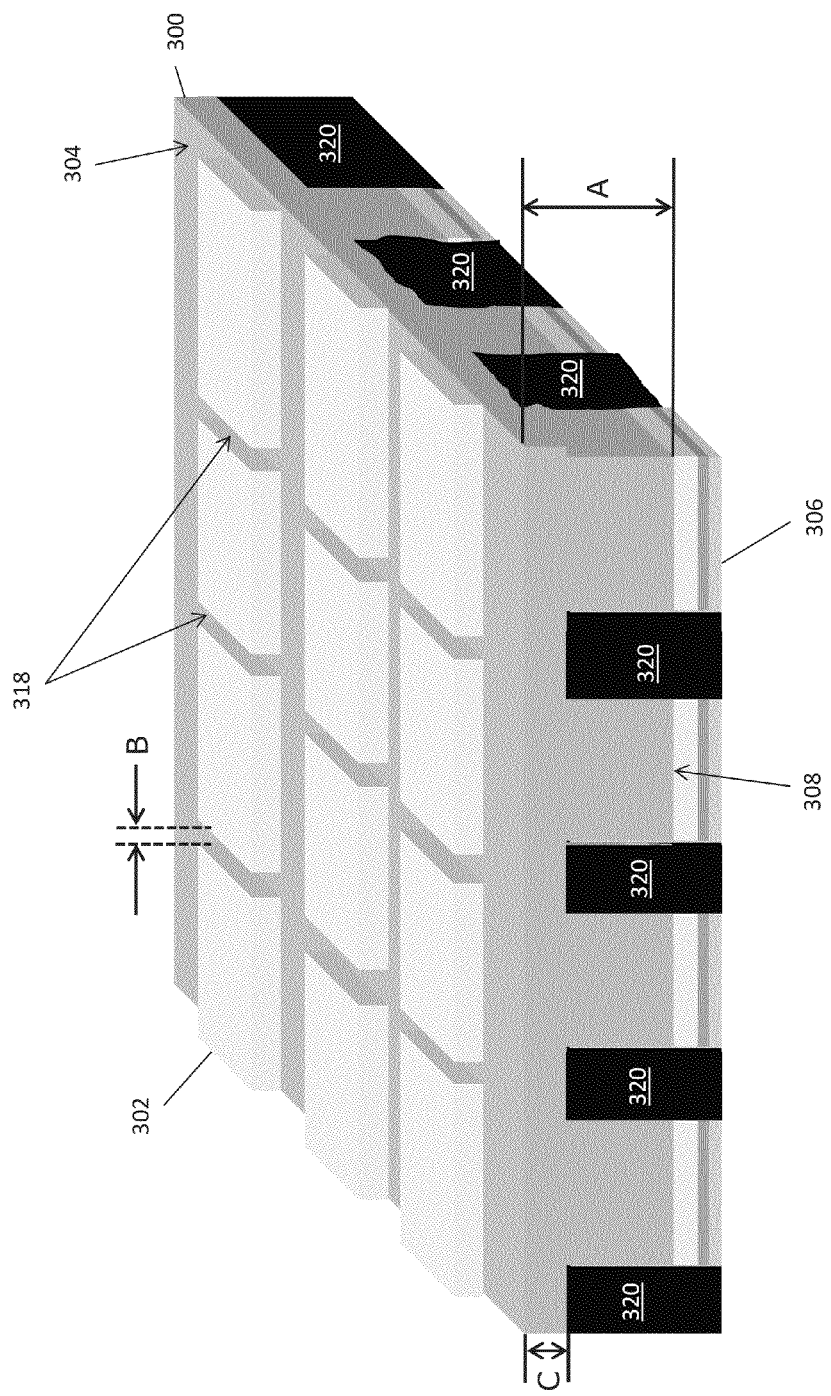

FIG. 3, which includes FIGS. 3A through 3C, illustrates an embodiment of a method of pre-molding recessed regions of a leadframe. FIG. 3A shows a top perspective view of a leadframe 300 prior to the pre-molding process, and FIG. 3B shows the corresponding bottom perspective view. A patterned die attach material 302 such as solder is disposed on the top (front) surface 304 of the leadframe 300. The top surface 304 of the leadframe 300 is solid (i.e. no gaps or openings) and planar according to this embodiment. A metallization 306 disposed on the bottom (back) surface 308 of the leadframe 300 comprises Ni 310, Pd 312 and Au 314 according to this embodiment. During the leadframe manufacturing process, the backside of the leadframe is patterned so recessed regions 316 extend from the bottom surface 308 of the leadframe 300 toward the top surface 304. The leadframe 300 is thinner ($A_{rec}$) in the recessed regions 316 and thicker (A) elsewhere as previously described herein. Gaps (spaces) 318 in the die attach metallization 302 on the top surface 304 of the leadframe 300 are aligned with the recessed regions 316. FIG. 3C shows the leadframe 300 after the pre-molding process, in which the recessed regions 316 are filled with a molding compound 320. The molding compound 320, in conjunction with the metallization 306 disposed on the bottom surface 308 of the leadframe 300, protects the leadframe 300 from the subsequent chemical etching process used to form leads e.g. as described previously herein in conjunction with FIG. 2D. The patterned die attach metallization 302 on the top surface 304 of the leadframe 300 is not removed by the etching process, protecting the part of the leadframe 300 covered by the die attach metallization 302. Because the leadframe 300 is thinner in the recessed regions 316 and thicker elsewhere, less leadframe material is removed to form the leads and therefore a lead spacing to leadframe thickness ratio of B/A<1 can be realized.

Spatially relative terms such as "under", "below", "lower", "over", "upper" and the like, are used for ease of description to explain the positioning of one element relative to a second element. These terms are intended to encompass different orientations of the package in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing a molded flip-chip semiconductor package, the method comprising:
   providing a leadframe having opposing first and second main surfaces, a first metallization on the first main surface, a second metallization on the second main surface, and recessed regions which extend from the second main surface toward the first main surface;
   filling the recessed regions with a first molding compound such that the leadframe is protected by the first molding compound and the second metallization at a second side of the leadframe and exposed between gaps in the first metallization at a first side of the leadframe opposite the second side;
   etching the exposed part of the leadframe between the gaps in the first metallization with a chemical etchant to form spaced apart leads at the first side of the leadframe, the first molding compound and the second metallization protecting the leadframe from the chemical etchant at the second side;
   placing a plurality of semiconductor dies on the leadframe such that pads of the semiconductor dies face the leads of the leadframe;
   attaching the pads to the leads of the leadframe; and
   encasing the semiconductor dies with a second molding compound that fills the space between the leads such that the second molding compound abuts the first molding compound,
   wherein the first molding compound is a multi-functional molding compound and the second molding compound is multi-aromatic molding compound.

2. The method of claim 1, wherein the leadframe comprises copper and the second metallization comprises gold, and wherein the chemical etchant etches copper selective to gold and selective to the first molding compound such that the first molding compound and the second metallization protect the leadframe from the chemical etchant at the second side.

3. The method of claim 2, wherein the second metallization comprises NiPdAu and the chemical etchant comprises ammonia.

4. The method of claim 1, wherein the exposed part of the leadframe between the gaps in the first metallization is etched by the chemical etchant such that the leads have a non-uniform width over the thickness of the leads.

5. The method of claim 4, wherein the width of the leads decreases further from the first main surface to a minimum and then increases.

6. The method of claim 1, wherein the exposed part of the leadframe between the gaps in the first metallization is etched with the chemical etchant such that sidewalls of the leads are undercut.

7. The method of claim 6, wherein the undercut at each side of the leads ranges from 5% to 40% of the thickness of the leads.

8. A molded flip-chip semiconductor package, comprising:
   a leadframe having opposing first and second main surfaces, a first metallization on the first main surface, a second metallization on the second main surface, recessed regions which extend from the second main surface toward the first main surface, and spaced apart leads chemically etched into the leadframe between gaps in the first metallization;
   a semiconductor die having a plurality of pads facing and attached to the leads of the leadframe;
   a first molding compound that fills the recessed regions; and
   a second molding compound that encases the semiconductor die and fills the space between the leads such that the second molding compound abuts the first molding compound,
   wherein A is the overall thickness of the leadframe,
   wherein B is the spacing between adjacent ones of the leads,
   wherein B/A<1,
   wherein the first molding compound is a multi-functional molding compound and the second molding compound is multi-aromatic molding compound.

9. The molded flip-chip semiconductor package of claim 8, wherein 0.2<B/A<1.

10. The molded flip-chip semiconductor package of claim 8, wherein the leadframe comprises copper and the second metallization comprises gold.

11. The molded flip-chip semiconductor package of claim 10, wherein the second metallization comprises NiPdAu.

12. The molded flip-chip semiconductor package of claim 8, wherein the leads have a non-uniform width over the thickness of the leads.

13. The molded flip-chip semiconductor package of claim 12, wherein the width of the leads decreases further from the first main surface to a minimum and then increases.

14. The molded flip-chip semiconductor package of claim 8, wherein the leads have curved sidewalls.

15. A molded flip-chip semiconductor package, comprising:
   a leadframe having opposing first and second main surfaces, a first metallization on the first main surface, a second metallization on the second main surface, recessed regions which extend from the second main surface toward the first main surface, and spaced apart leads chemically etched into the leadframe between gaps in the first metallization;
   a semiconductor die having a plurality of pads facing and attached to the leads of the leadframe;
   a first molding compound that fills the recessed regions; and
   a second molding compound that encases the semiconductor die and fills the space between the leads such that the second molding compound abuts the first molding compound,
   wherein A is the overall thickness of the leadframe,
   wherein B is the spacing between adjacent ones of the leads,
   wherein B/A<1,
   wherein the first molding compound comprises a liquid crystal polymer or an aluminium nitride filled thermoplastic resin.

* * * * *